(12) United States Patent
Hobbs et al.

(10) Patent No.: US 8,028,853 B2
(45) Date of Patent: Oct. 4, 2011

(54) CRYOSTAT COMPRISING A CRYOGEN VESSEL SUSPENDED WITHIN AN OUTER VACUUM CONTAINER

(75) Inventors: Matthew Hobbs, Oxford (GB); Nicholas Mann, Compton (GB)

(73) Assignee: Siemens Plc, Frimley, Camberley, Surrey (GB)

( * ) Notice: Subject to any disclaimer, the term of this patent is extended or adjusted under 35 U.S.C. 154(b) by 1076 days.

(21) Appl. No.: 11/823,000

(22) Filed: Jul. 11, 2007

(65) Prior Publication Data
US 2008/0022698 A1      Jan. 31, 2008

(30) Foreign Application Priority Data
Jul. 25, 2006  (GB) .................................. 0614734.2

(51) Int. Cl.
*F17C 1/00*    (2006.01)
(52) U.S. Cl. ............. 220/560.1; 257/E39.002; 335/216; 29/428; 62/51.1; 428/34.1; 156/247; 241/24.28

(58) Field of Classification Search .................. 62/51.1; 156/247; 241/24.28; 428/34.1; 220/560.1; 257/E39.002; 335/216; 29/428
See application file for complete search history.

(56) References Cited

FOREIGN PATENT DOCUMENTS
GB   2 426 545 A   11/2006
JP   60147105   *   3/1985
* cited by examiner

*Primary Examiner* — Anthony Stashick
*Assistant Examiner* — Elizabeth Volz
(74) *Attorney, Agent, or Firm* — Crowell & Moring LLP

(57) ABSTRACT

A cryostat comprises a cryogen vessel suspended within an outer vacuum container, the cryogen vessel is supported by an arrangement that includes at least one housing mounted on an exterior surface of the outer vacuum container and arranged to function as a floor mounting foot, for supporting weight of the cryogen vessel and the outer vacuum container, and at least two mounting points mounted within the housing(s). Each of at least two suspension elements (an upper suspension element and a lower suspension element) extends through a hole in the surface of the outer vacuum container, between the respective mounting point and a respective point on the cryogen vessel.

10 Claims, 2 Drawing Sheets

CRYOSTAT COMPRISING A CRYOGEN VESSEL SUSPENDED WITHIN AN OUTER VACUUM CONTAINER

The present invention relates to arrangements for suspending an article within a vessel, and particularly relates to arrangements for suspending a cryogen vessel within an outer vacuum container. Such arrangements are useful in housing magnets for imaging systems such as magnetic resonance imaging (MRI) or nuclear magnetic resonance (NMR) systems. The present invention, however, finds application in any applications which require a cryogen vessel to be suspended within a vacuum filled outer vessel.

BACKGROUND AND SUMMARY OF THE INVENTION

FIG. 1 illustrates a cross-sectional view of a conventional solenoidal magnet arrangement for a nuclear magnetic resonance (NMR) or magnetic resonance imaging (MRI) system. A number of coils of superconducting wire are wound onto a former 1. The resulting assembly is housed inside a cryogen vessel 2 which is at least partly filled with a liquid cryogen 2a at its boiling point. The coils are thereby held at a temperature below their critical point.

Also illustrated in FIG. 1 are an outer vacuum container 4 and thermal shield 3. As is well known, these serve to thermally isolate the cryogen vessel 2, typically containing a liquid cryogen 2a, from the surrounding atmosphere. Solid insulation 5 may be placed inside the space between the outer vacuum container 4 and the thermal shield 3. A central bore 4a is provided, of a certain dimension to allow access for a patient or other subject to be imaged.

Conventionally, a number of supporting elements 7 are connected between the cryogen vessel 2 and the outer vacuum container 4 to bear the weight of the cryogen vessel. These may be tensile bands, tensile rods, straps, compression struts or any known element suitable for the purpose. The elements should have a very low thermal conductivity. This is important in order to minimise heat influx from the outer vacuum container 4, which is typically at ambient temperature, to the cryogen vessel 2. The suspension elements typically pass through holes in the thermal shield 3. Similar, or alternative, suspension arrangements may be provided to retain the thermal shield 3.

Copending United Kingdom patent application GB2426545 describes a particularly advantageous arrangement of support straps for use in such systems.

Typically, a floor mounted system will require mounting feet 6 or similar, attached to the outer vacuum container to support the weight of the system as a whole.

A disadvantage of the conventional arrangement results from the fact that the outer vacuum container 4 must carry all of the forces required to support the cryogen vessel 2 and its contents. The outer vacuum container 4 is the largest component in the illustrated system, and must be made of thick material in order to support such heavy loading.

The present invention aims to provide an alternative support arrangement, wherein the outer vacuum container need not be of thick material, since it does not bear the forces required to support the cryogen vessel, or other supported equipment.

According to the present invention, therefore, suspension of the cryogen vessel is provided by tensile bands, tensile rods, straps, compression struts or any known element suitable for the purpose. In particular, these elements are connected between the cryogen vessel 2 and a housing provided on the outer surface of the outer vacuum container.

BRIEF DESCRIPTION OF THE DRAWINGS

The above, and further, aims, advantages and characteristics of the present invention will become more apparent from the following description of certain embodiments thereof, along with the accompanying drawings, wherein.

DETAILED DESCRIPTION OF THE INVENTION

Figure 1:
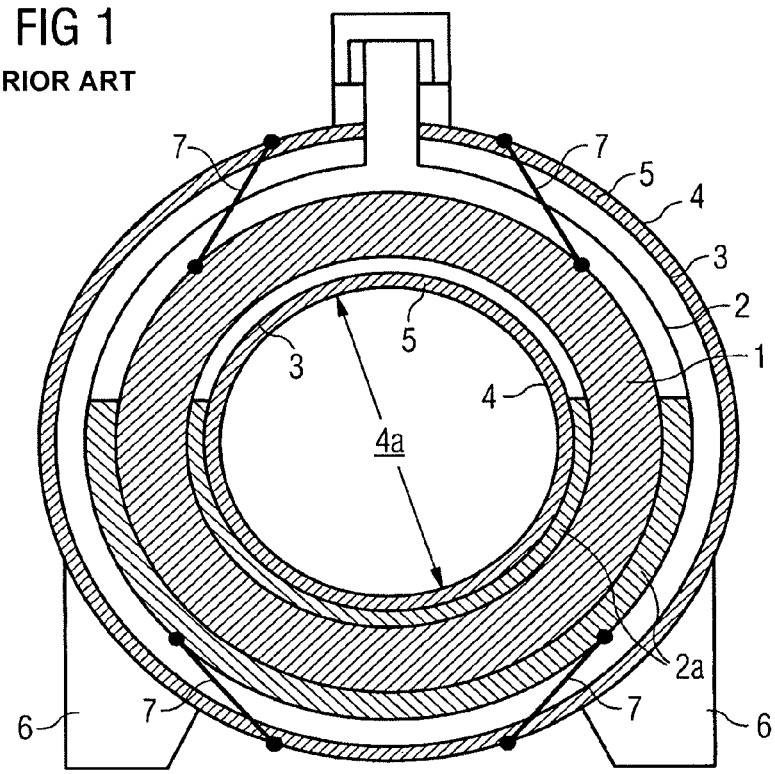
FIG. 1 illustrates a cross-sectional view of a conventional solenoidal magnet arrangement for a nuclear magnetic resonance (NMR) or magnetic resonance imaging (MRI) system.
Figure 2:
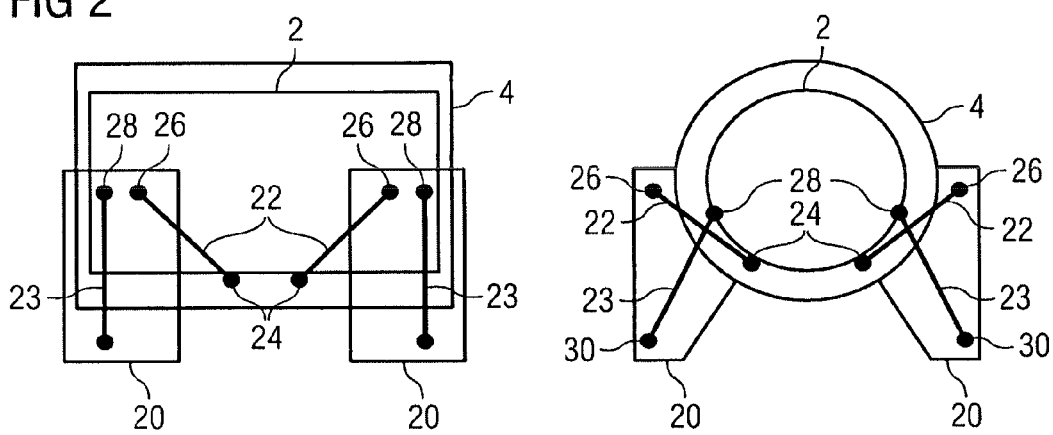
FIG. 2 schematically illustrates the principle of the present invention.

FIG. 2 schematically illustrates the principle of the present invention, wherein a housing is provided in the form of a foot 20, providing floor mounting for the system, and supporting at least some of the weight of cryogen vessel and the outer vacuum container. In some embodiments, a single housing (foot) is provided along each side of the outer vacuum container 4. In alternative embodiments, a plurality of housings (feet) may be placed at selected locations along each side of the outer vacuum container 4. The locations will be selected so as to provide an acceptable combination of floor support for the system as a whole, and support for the cryogen vessel 2 within the outer vacuum container 4.

As shown in FIG. 2, the support arrangement of the present invention typically involves a plurality of upper support elements 22 and a plurality of lower support elements 23. The upper support elements 22 connect between a relatively low point 24 on the cryogen vessel and a relatively high point 26 in the housing 20. The lower support elements 23 connect between a relatively high point 28 on the cryogen vessel and a relatively low point 30 in the housing 20.

Any of the upper support elements 22 and lower support elements 23 may be arranged to be held under tension, or in compression, so as to prevent relative movement of the cryogen vessel and the outer vacuum container and to support at least some of the weight of the cryogen vessel.

The various support elements are arranged in calculated angular configurations, determined according to methods known to those skilled in the art to provide an acceptable combination of support and resistance to translation and rotation in all possible directions. Advantageously, the number of support elements used is kept to a minimum, since each support element 22, 23 represents a thermal conduction path from the relatively high-temperature outer vacuum container 4 to the much colder cryogen vessel 2.

In certain embodiments, it may be found advantageous to locate suspension elements in planar configurations, with additional components provided as required to provide the required resistance to translation and rotation.

In preferred embodiments of the present invention, the suspension elements 22, 23 are each arranged to be as long as is practical, to increase their thermal resistance and tot hereby reduce the thermal influx carried by each suspension element. In practice, this will mean that lower suspension elements 23 are mounted 28 high on the cryogen vessel and are mounted 30 low on the housing 20, while upper suspension elements 22 are mounted 24 low on the cryogen vessel and are mounted 26 high on the housing 20.

While the arrangement shown in FIG. 2 illustrates only the suspension elements required for suspending the cryogen vessel 2 within the outer vacuum container 4, similar arrangements are preferably provided for supporting thermal shield(s) 3. The shield(s) 3 weigh much less than the cryogen vessel 2 and its contents, so the advantages gained from the arrangement of the invention by avoiding load bearing on the outer vacuum container 4 are not so significant when applied to the shield(s). However, the arrangement of the present invention may allow longer, more thermally resistant suspension elements 22, 23 to be used, limiting the thermal influx to the shield(s). In addition, it may be simpler to arrange support of the shield(s) 3 according to the arrangement of the present invention in cases where the cryogen vessel 2 is supported according to the present invention, rather than providing two different types of suspension arrangement within a single system. Optionally, the shield(s) may be supported by the same suspension elements 22, 23 which support the cryogen vessel 2.

Figure 3:
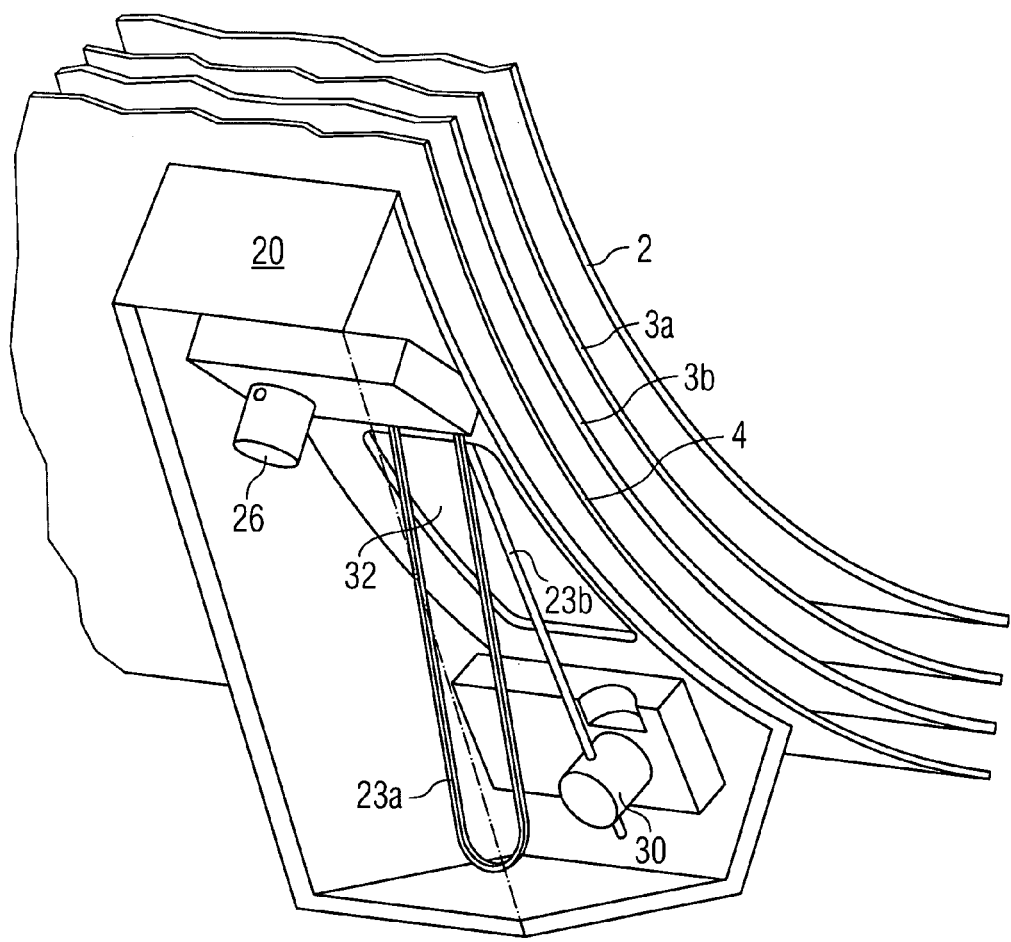
FIG. 3 shows a cutaway view of certain components of a suspension arrangement according to an embodiment of the present invention.

FIG. 3 illustrates a partial cut-away of a housing 20 according to an embodiment of the present invention. The housing is arranged to function as a floor mounting foot, for supporting at least some of the weight of the cryogen vessel and the outer vacuum container. As illustrated, a cryogen vessel 2 is provided within an outer vacuum container 4. Two thermal radiation shields 3a, 3b are provided and are located intermediate the outer vacuum container 4 and the cryogen vessel 2. Housing 20 is provided on the outer surface of the outer vacuum container 4. A hole 32 is provided in the wall of the outer vacuum container, enabling support elements such as tensile band 23a or rod 23b to pass from the inside of the outer vacuum container 4 to the inside of housing 20. Since the housing 20 will be evacuated, it must be constructed and sealed to the outer vacuum container in a sufficiently airtight manner to maintain a hard vacuum.

In the illustrated embodiment, rod support element 23b is attached to the thermal shields 3a, 3b, while tensile support band 23a is attached to the cryogen vessel 2. Holes must be provided in each thermal radiation shield to allow support elements such as 23a to support the cryogen vessel.

Mounting point 30 provides mechanical support for rod support element 23b. Other types of support member such as band 23a will require alternative mounting points, as appropriate. Mounting point 26, for upper support members 22, is illustrated, although no upper support members are shown in the figure in the interests of clarity.

According to the present invention, a number of housings 20 are provided, and support members are arranged such that the cryogen vessel may be supported by support members attached to a housing 20 mounted on the surface of the outer vacuum container. This allows the outer vacuum container itself to be constructed of thin, light material, since it does not need to bear the forces required to mechanically support the cryogen vessel. The housings 20 are likely constructed of thick, strong material but are relatively inexpensive and easy to fabricate, as compared to a structurally reinforced outer vacuum container, as in the conventional solution.

The present invention provides an advantageous thermally resistive suspension for a cryogen vessel and/or thermal shield(s) within an outer vacuum container, such as is used for housing superconducting magnets for nuclear magnetic resonance or magnetic resonance imaging systems.

According to the invention, loads supporting the cryogen vessel and/or thermal shield(s) are borne by a housing mounted on the outer surface of the outer vacuum container. The housing is arranged to function also as a floor mounting foot, a component which would be necessary in any case. This enables the outer vacuum container to be manufactured of sufficient strength to bear its own weight and external atmospheric pressure, where appropriate, without needing sufficient strength to support the cryogen vessel and/or thermal shield(s). In conventional arrangements, it has been found necessary to strengthen the outer vacuum container by way of thick walls, or strengthening arrangements such as buttresses, or doubler plates.

The invention claimed is:

1. A cryostat comprising a cryogen vessel suspended within an outer vacuum container by an arrangement comprising:
    at least one housing mounted on an exterior surface of the outer vacuum container and arranged to function as a floor mounting foot, for supporting weight of the cryogen vessel and the outer vacuum container;
    at least two mounting points formed within each of the at least one housing; and
    at least an upper suspension element and a lower suspension element; wherein,
    the lower suspension element is mounted on the cryogen vessel at a point that is above a point at which the upper suspension element is mounted on the cryogen vessel; and
    the upper suspension element is mounted within the at least one housing on a mounting point that is positioned above a mounting point on which the lower suspension element is mounted within the at least one housing;
    each of the at least two suspension elements extends through a hole in the surface of the outer vacuum container between the respective mounting point and a respective point on the cryogen vessel, such that each suspension element is held in compression or tension, thereby bearing at least part of the weight of the cryogen vessel; and
    the outer vacuum container is evacuated, and the at least one housing is constructed and sealed to the outer vacuum container over the, or each respective, hole in a sufficiently airtight manner to maintain the vacuum within the outer vacuum container.

2. The cryostat according to claim 1, wherein two housings are provided, each extending along one side of the outer vacuum container.

3. The cryostat according to claim 1, wherein a plurality of housings are provided, along each side of the outer vacuum container.

4. The cryostat according to claim 1, wherein the suspension element(s) comprise at least one of the following: tensile bands, tensile rods, straps, compression struts.

5. The cryostat according to claim 1, further comprising a thermal radiation shield located between the cryogen vessel and the outer vacuum container, wherein a plurality of holes are provided in the radiation shield to allow the suspension elements to pass therethrough.

6. The cryostat according to claim 5, wherein the thermal radiation shield is supported by at least one of the suspension elements.

7. The cryostat according to claim 5, wherein:
    the thermal radiation shield is supported by at least an upper suspension element and a lower suspension element the lower suspension element is mounted on the thermal radiation shield at a point that is above a point at which the upper suspension element is mounted on the thermal radiation shield;

the upper suspension element is mounted within the at least one housing on a mounting point that is positioned above a mounting point on which the lower suspension element is mounted within the at least one housing;

each of the at least two suspension elements extends through a hole in the surface of the outer vacuum container between the respective mounting point and a respective point on the cryogen vessel, such that each suspension element is held in compression or tension, thereby bearing at least part of the weight of the thermal radiation shield.

8. A cryostat comprising:

an outer vacuum container;

a cryogen vessel suspended within the outer vacuum container; and a floor mounting foot that supports at least a portion of the weight of the cryogen vessel; wherein, said floor mounting foot comprises a housing that is attached and sealed to an outer surface of the outer vacuum container, with an opening connecting an interior of the housing with an interior of the outer vacuum container;

said cryogen vessel is suspended within said outer vacuum container by at least upper and lower suspension elements that extend through said opening in said outer vacuum container, are connected between respective mounting points on said cryogen vessel and mounting points on said housing, and transmit the weight of the cryogen vessel directly to mounting points on said housing.

9. The cryostat according to claim 8, wherein:

the lower suspension element is mounted on the thermal radiation shield at a point that is above a point at which the upper suspension element is mounted on the thermal radiation shield;

the upper suspension element is mounted within the housing on a mounting point that is positioned above a mounting point on which the lower suspension element is mounted within the housing.

10. A cryostat comprising:

an outer vacuum container;

a cryogen vessel suspended within the outer vacuum container; and at least one floor mounting foot that is mounted and sealed on an exterior surface of the outer vacuum container; wherein;

at least the cryogen vessel is mechanically coupled directly to and supported by the at least one floor mounting foot, via upper and lower supporting elements that extend through a hole that opens between an interior of the outer vacuum container and an interior of the at least one floor mounting foot;

the lower suspension element is mounted on the cryogen vessel at a point that is above a point at which the upper suspension element is mounted on the cryogen vessel; and the upper suspension element is mounted within the housing on a mounting point that is positioned above a mounting point on which the lower suspension element is mounted within the housing.

* * * * *